(12) United States Patent
Tu

(10) Patent No.: US 7,675,054 B2
(45) Date of Patent: Mar. 9, 2010

(54) PHASE CHANGE MEMORY DEVICES AND METHODS FOR FABRICATING THE SAME

(75) Inventor: Li-Shu Tu, Taoyuan County (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies Inc., Hsinchu (TW); Winbond Electronics Corp., Hsinchu (TW)

( * ) Notice: Subject to any disclaimer, the term of this patent is extended or adjusted under 35 U.S.C. 154(b) by 59 days.

(21) Appl. No.: 12/016,093

(22) Filed: Jan. 17, 2008

(65) Prior Publication Data
US 2009/0101884 A1    Apr. 23, 2009

(30) Foreign Application Priority Data
Oct. 17, 2007  (TW) .............................. 96138826 A

(51) Int. Cl.
*H01L 29/04* (2006.01)

(52) U.S. Cl. ................. 257/3; 257/4; 257/506; 257/522; 257/E29.17; 365/148; 438/411; 438/207; 438/319

(58) Field of Classification Search ................. 257/1–5, 257/276, 506, 522; 365/148; 438/900, 214, 438/280, 411, 619, 207, 218, 219, 294, 427, 438/319, 461, 611
See application file for complete search history.

(56) References Cited

U.S. PATENT DOCUMENTS
2008/0266940 A1* 10/2008 Lai et al. ..................... 365/163
2009/0101883 A1*  4/2009 Lai et al. ........................ 257/3

FOREIGN PATENT DOCUMENTS
CN         1971931 A    5/2007
CN         1971960 A    5/2007

* cited by examiner

*Primary Examiner*—Evan Pert
*Assistant Examiner*—Scott R Wilson
(74) *Attorney, Agent, or Firm*—Quintero Law Office

(57) ABSTRACT

Phase change memory devices and methods for fabricating the same are provided. A phase change memory device includes a first conductive electrode disposed in a first dielectric layer. A second dielectric layer is disposed over the first dielectric layer. A phase change material layer is disposed in the second dielectric layer and electrically connected to the first conductive electrode. A space is disposed in the second dielectric layer to at least isolate a sidewall of the phase change material layer and the second dielectric layer adjacent thereto. A second conductive electrode is disposed in the second dielectric layer and electrically connected to the phase change material layer.

12 Claims, 3 Drawing Sheets

PHASE CHANGE MEMORY DEVICES AND METHODS FOR FABRICATING THE SAME

BACKGROUND OF THE INVENTION

1. Field of the Invention

The invention relates to memory devices and more particularly to phase change memory devices and methods for fabricating the same.

2. Description of the Related Art

Phase change memory devices are non-volatile, highly readable, highly programmable, and require low driving voltage/current. Current trends in phase change memory development are to increase cell density and reduce current density.

Phase change material in a phase change memory device has at least two solid phases, a crystalline state and an amorphous state. Transformation between these two phases can be achieved by changing the temperature of the phase change material. The phase change material exhibits different electrical characteristics depending on its state. For example, in its amorphous state the material exhibits a higher resistivity than in the crystalline state. Such phase change material may switch between numerous electrically detectable conditions of varying resistivities on a nanosecond time scale with the input of pico joules of energy. Since phase change material allows for a reversible phase transformation, memory bit status can be distinguished by determining the phase of phase change material in the memory bit.

For enhancing applications of phase change memory devices, size reduction of the memory cells in a phase change memory device is needed to increase cell density of the phase change memory device. With size reduction of the memory cells, however, pitches between adjacent memory cells are also reduced and may thus increases thermal disturbing or thermal cross-talk between adjacent memory cells of the phase change memory device. Therefore, undesired disturbing and/or bit-writing errors may occur to memory cells of the phase change memory device during operation.

BRIEF SUMMARY OF THE INVENTION

Phase change memory devices and methods for fabricating the same are provided to thereby solve the aforementioned challenges and improve upon conventional phase change memory devices.

An exemplary embodiment of a phase change memory device comprises a first conductive electrode disposed in a first dielectric layer. A second dielectric layer is disposed over the first dielectric layer and a phase change material layer is disposed in the second dielectric layer, wherein the phase change material layer is stacked over the first conductive electrode. A space is disposed in the second dielectric layer to at least isolate a sidewall of the phase change material layer and the second dielectric layer adjacent thereto. A second conductive electrode is disposed in the second dielectric layer and stacks over the phase change material layer.

An exemplary embodiment of a method for fabricating a phase change memory device comprises providing a first dielectric layer with a first conductive electrode formed therein. A phase change material layer is formed over a portion of the first dielectric layer, wherein the phase change material layer is stacked over the first conductive electrode. A sacrificial layer and an etching stop layer are sequentially formed to conformably cover the phase change material layer and an etching stop layer on top of the sacrificial layer. A second dielectric layer is blanketly formed over the etching stop layer. The second dielectric layer, the etching stop layer, and the sacrificial layer are partially removed to form a gap surrounding the phase change material layer. A third dielectric layer is blanketly formed over the etching stop layer, the phase change material layer and the gap, so that a space between the phase change material layer and the etching stop layer is formed. A second conductive electrode is formed in the third dielectric layer, wherein the second conductive electrode is stacked over the phase change material layer. A conductive layer is formed over the third dielectric layer to contact the second conductive electrode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments of phase change memory devices and methods for fabricating the same are described as below incorporating FIGS. 1-5. The schematic diagrams merely illustrate cross sections of a plurality of memory cells of a phase change memory device during various fabrication steps thereof. It's noted that the phase change memory device may further comprise suitable conductive members (e.g. interconnecting plugs or interconnecting lines) for electrically connecting a sequentially formed memory cell structure with an underlying active device (e.g. transistors or diodes) or a conductive line. For simplicity, these conductive members and/or active devices are not illustrated in the incorporated schematic diagrams.

Figure 1:
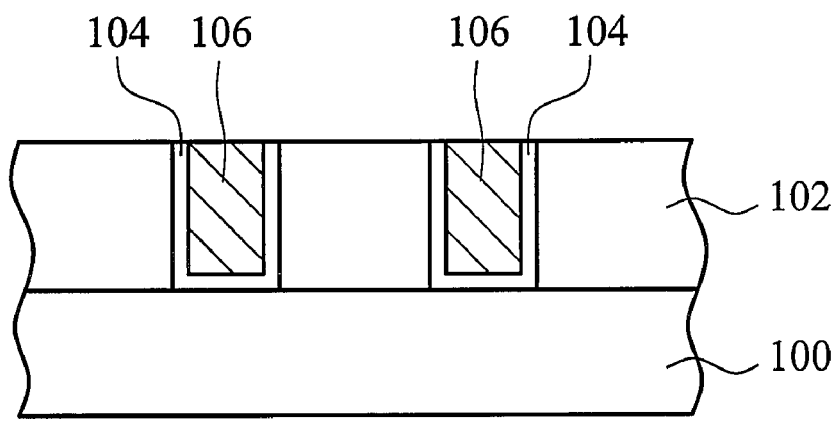
FIGS. 1-5 are schematic diagrams respectively showing a cross section in various fabrication steps of a phase change memory device according to an embodiment of the invention.

In FIG. 1, a substantially fabricated phase change memory device is first provided, including a semiconductor structure 100. The semiconductor structure 100 is illustrated as a plane layer here and may include active devices (not shown) such as transistors or diodes formed over or in a semiconductor substrate. A dielectric layer 102 is formed over the semiconductor structure 100, including two conductive contacts formed therein. Each of the conductive contacts may respectively contact with an active device (not shown) formed over or in the semiconductor structure 100.

As shown in FIG. 1, the conductive contacts formed in the dielectric layer 102 are composed of a conductive layer 106 and a diffusion barrier layer 104 formed between the conductive layer 106 and the adjacent dielectric layer 102. Herein, the diffusion barrier layer 104 surrounds the sidewalls and bottom surface of the conductive layer 106 to thereby prevent conductive materials in the conductive layer 106 from diffusing into adjacent dielectric layer 102 or semiconductor structure 100 and from affecting performances of the active device therein. Due to formation of the conductive contacts, electrical connections between the active devices (not shown) in the semiconductor structure 100 and the sequentially formed phase change memory cell structure can be achieved. The conductive contacts can be formed by conventional contacts processes and are not described here in detail for brevity.

Figure 2:
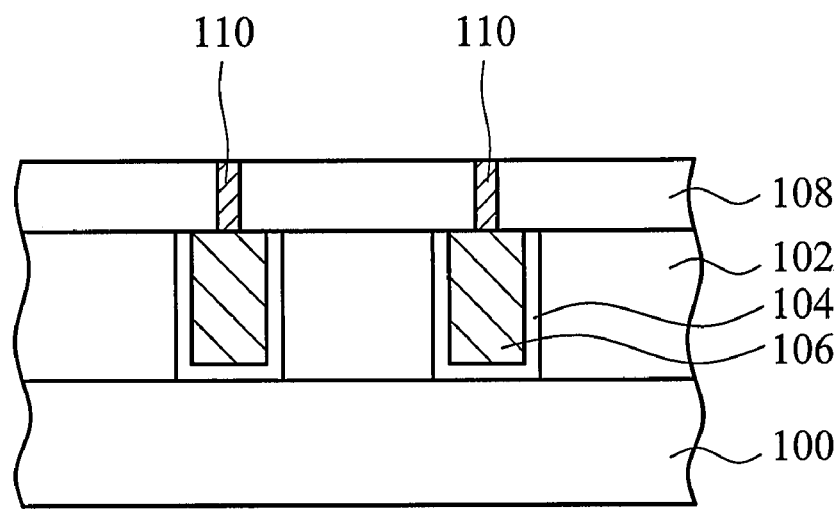

In FIG. 2, a dielectric layer 108 is then formed over the dielectric layer 102 and a plurality of electrically isolated conductive electrodes 110 are next formed in the dielectric layer 108. Each of the conductive electrodes 110 respectively aligns and electrically contacts to a conductive layer 106 thereunder and is stacked over the conductive layer 106. Herein, compared with the conductive layer 106, the conductive electrode 110 is formed with a reduced size and may comprise titanium (Ti), aluminum (Al), tungsten (W) and alloys thereof. The conductive electrode 110 can be formed by physical vapor deposition such as sputtering. The dielectric layer 102 may comprise oxygen-containing silicon materials such as borophosphosilicate glass (BPSG), silicon oxide and spin-on glass (SOG).

Figure 3:
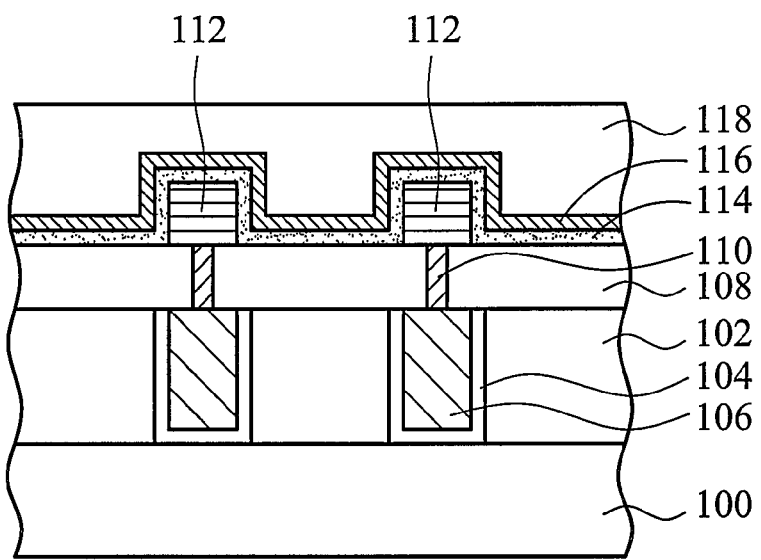

In FIG. 3, a layer of phase change material (not shown) is then formed over the dielectric layer 108, having a thickness of about 300-2000 Å, to thereby cover the dielectric layer 108 and the conductive electrodes 110 as shown in FIG. 2. Herein, the layer of the phase change material may comprise chalcogenide materials such as Ge—Sb—Te trinary chalcogenide compound or Te—Sb binary chalcogenide compound and can be formed by, for example, physical vapor deposition. The layer of phase change material is then patterned by conventional photolithography and etching processes (both not shown) to thereby form a plurality of patterned phase change material layers 112 over the dielectric layer 108. The phase change material layers 112 respectively cover one of the underlying conductive electrodes 110.

Still referring to FIG. 3, a sacrificial layer 114 and an etching stop layer 116 are sequentially formed over the dielectric layer 108 and the phase change material layer 112. The sacrificial layer 114 and the etching stop layer 116 are conformably formed over the dielectric layer 108 and the phase change material layer 112. Herein, the sacrificial layer 114 may include dielectric materials such as silicon oxide and silicon nitride and has a thickness of about 30-200 Å. The sacrificial layer 114 and the underlying dielectric layer 108 may comprise the same or different dielectric materials. The etching stop layer 116 may include dielectric materials such as silicon nitride and has a thickness of about 200-500 Å and the sacrificial layer 114 may comprise dielectric material different from that of the etching stop layer 116, thereby providing suitable etching selectivity under the same etching chemicals. Next, a dielectric layer 118 is blanketly formed over the etching stop layer 116. The dielectric layer 118 may comprise oxygen-containing silicon materials such as borophosphosilicate glass (BPSG), silicon oxide and spin-on glass (SOG) and has a thickness of about 3000-8000 Å. The dielectric layer 118 may comprise the same or different material as that of the underlying dielectric layer 108. Herein, material of the dielectric layer 118 is the same as that of the sacrificial layer 114 and the dielectric layer 118 and the sacrificial layer 114 can be removed at the same time in a sequential etching process. After formation of the dielectric layer 118, a substantially planar surface as shown in FIG. 3 is thus obtained.

Figure 4:
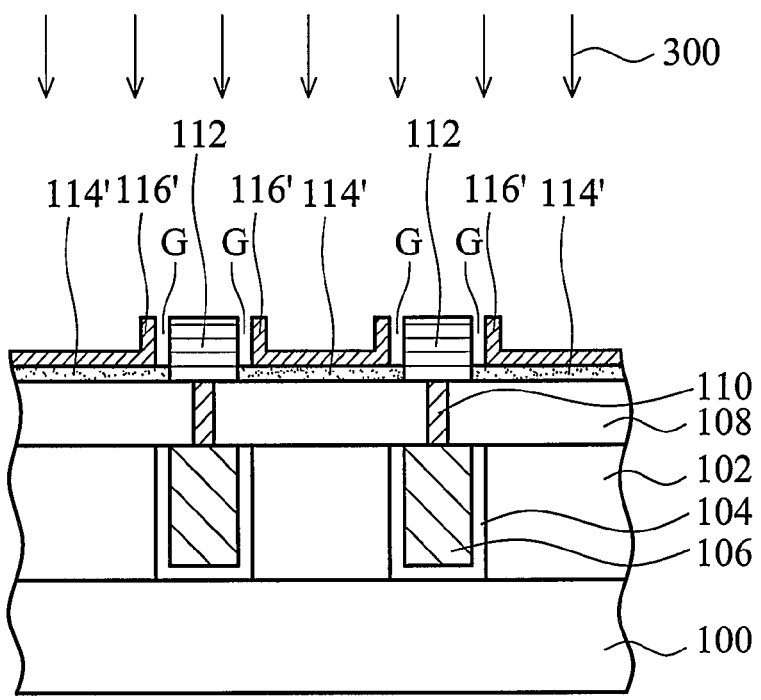

In FIG. 4, a planarization process (not shown) such as a chemical mechanical polishing (CMP) process is next performed to partially remove the dielectric layer 118, the etching stop layer 116 and the sacrificial layer 114 above a top surface of the phase change material layer 112, thereby exposing a top surface of the phase change material layer 112 and a portion of the sacrificial layer 114. The remained etching stop layer 116' is also formed after the planarization process.

Next, an etching process 300 is performed to remove the dielectric layer 118 and partially remove the sacrificial layer 114, thereby forming a gap G between the sidewalls of each of the phase change material layers 112 and the etching stop layer 116' adjacent thereto. As shown in FIG. 4, each of the gaps G now exposes a portion of the sacrificial layer 114' thereunder. The etching process 300 can be, for example, a wet etching process and can be controlled by a time-mode etching.

Figure 5:
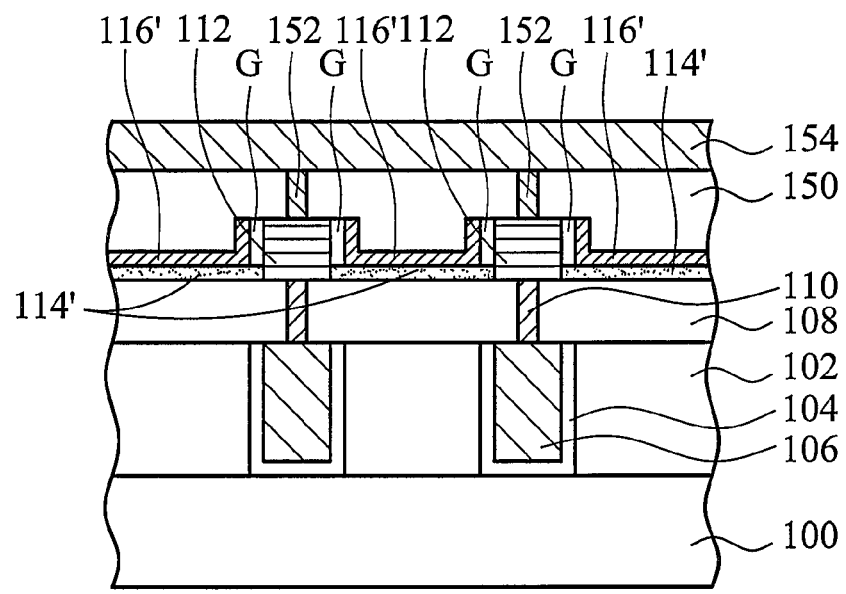

In FIG. 5, a dielectric layer 150 is then blanketly formed over the phase change material layer 112 and the etching stop layer 116' to thereby provide a substantially planar surface. The dielectric layer 150 may comprise oxygen-containing silicon material such as BPSG, silicon oxide, or spin-on glass (SOG) and can be formed by, for example, chemical vapor deposition or spin-on method. During formation of the dielectric layer 150, since the gaps G are formed with a relative small width, the material of the dielectric layer 150 will not fill into the gaps G formed between the sidewalls of the phase change material layer 112 and the etching stop layer 116' adjacent thereto. Thus, the gap G is formed as a space between each sidewall of the phase change material layer 112 and the etching stop layer 116' and the dielectric layer 150 adjacent thereto after formation of the dielectric layer 150. Herein, the space may include air or is under near vacuum state (since formation of the dielectric layer 150 maybe performed in an ambient under extremely low pressure), therefore thermal conductivity in this region is much lower than that of the dielectric materials of the adjacent layers (e.g. sacrificial layer 114', etching stop layer 116', and the dielectric layer 150). Therefore, during memory cells operation such as heating the phase change material layer 112 at left side of the FIG. 5 to write bit data therein, the heated phase change material layer 112 will not cause heat conduction along a direction parallel to a surface of the semiconductor structure 100, which would transfer thermal energy in the phase change material layer 112 to the phase change material layer 112 of the adjacent memory cell structure (i.e. the phase change material layer 112 at right side of FIG. 5). Thus, thermal disturbances and thermal cross-talk for conventional phase change memory devices can be avoided while the phase change material device is formed with a reduced cell size.

Next, a plurality of conductive electrode 152 is formed in the dielectric layer 150. These conductive electrodes 152 are substantially formed and stacked over one of the phase change material layers 112, respectively. Fabrication and materials of the conductive electrode 152 are similar with that of the conductive electrodes 110 and are not described here in detail, for brevity. Next, a conductive layer 154 is formed over the dielectric layer 150. The conductive layer 154 covers the conductive electrodes 152 formed in the dielectric layer 150, thereby electrically connecting the phase change memory cells and the contacts and active devices (not shown) underlying each of the phase change memory cells.

Figure 6:
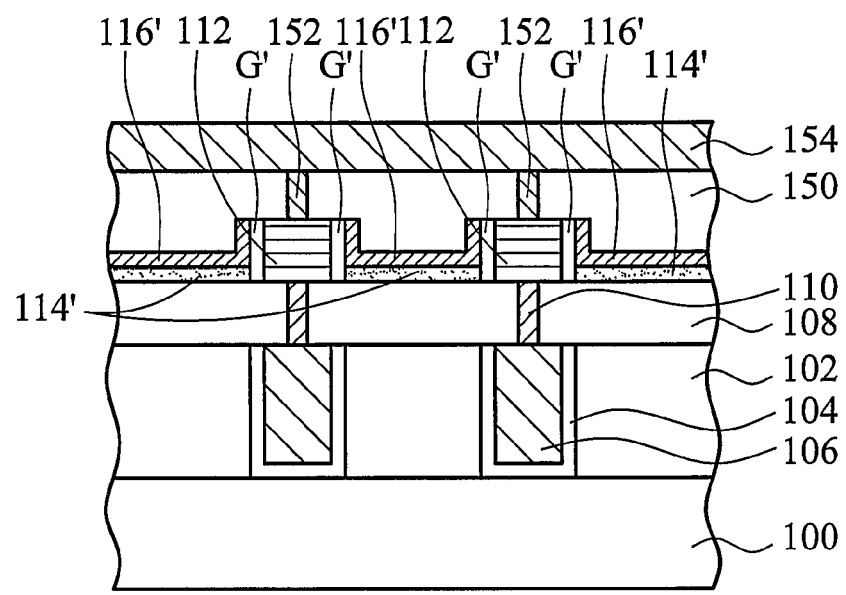
FIG. 6 is a schematic diagram showing a cross section of a phase change memory device according to another embodiment of the invention.

FIG. 6 illustrates a phase change memory device according to another embodiment. As shown in FIG. 6, the phase change memory device includes spaces G' which further exposes the underlying dielectric layer 108. Fabrication of such spaces G' can be achieved by extending etching time of the etching process 300 as shown in FIG. 4. Thus, during memory cell operation, such as heating of the phase change material layer 112 at left side of FIG. 6 to write bit data therein, the heated phase change material layer 112 will not transfer thermal energy therein along a direction parallel to a surface of the semiconductor structure 100 to the phase change material layer 112 adjacent thereto (i.e. the phase change material layer 112 at right side of FIG. 6). Thus, thermal disturbances and thermal cross talk for conventional phase change memory devices can be avoided while the phase change material device is formed with a reduced cell size.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device comprising:
   a first conductive electrode disposed in a first dielectric layer;
   a second dielectric layer disposed over the first dielectric layer;
   a sacrificial layer formed between the second dielectric layer and the first dielectric layer;
   a phase change material layer disposed in the second dielectric layer and electrically connected to the first conductive electrode;
   a space disposed in the second dielectric layer to at least isolate a sidewall of the phase change material layer from the second dielectric layer adjacent thereto; and
   a second conductive electrode disposed in the second dielectric layer and electrically connected to the phase change material layer.

2. The phase change memory device as claimed in claim 1 further comprising an etching stop layer embedded in the second dielectric layer, wherein the etching stop layer is formed between the space and the second dielectric layer and over the sacrificial layer.

3. The phase change memory device as claimed in claim 1 further comprising a third dielectric layer disposed under the first dielectric layer, wherein the third dielectric layer is embedded with at least one conductive layer and the first conductive electrode is electrically connected to the conductive layer.

4. The phase change memory device as claimed in claim 3 further comprising a conductive layer on the second dielectric layer, wherein the conductive layer is stacked over and electrically connected to the second conductive electrode.

5. The phase change memory device as claimed in claim 1, wherein the phase change material layer comprises chalcogenide materials.

6. The phase change memory device as claimed in claim 1, wherein the space comprises air or is under a nearly vacuum ambient.

7. A method for fabricating a phase change memory device, comprising:
   providing a first dielectric layer with a first conductive electrode formed therein;
   forming a phase change material layer over a portion of the first dielectric layer, wherein the phase change material layer is stacked over and electrically connected to the first conductive electrode;
   sequentially forming a sacrificial layer on the first dielectric layer to conformably cover the phase change material layer, and an etching stop layer on top of the sacrificial layer;
   blanketly forming a second dielectric layer over the etching stop layer;
   partially removing the second dielectric layer, the etching stop layer and the sacrificial layer to form a gap surrounding the phase change material layer;
   blanketly forming a third dielectric layer over the etching stop layer, the phase change material layer and the gap, so that a space between the phase change material layer and the etching stop layer is formed;
   forming a second conductive electrode in the third dielectric layer, wherein the second conductive electrode is stacked over and electrically connected to the phase change material layer; and
   forming a conductive layer over the third dielectric layer to contact the second conductive electrode.

8. The method as claimed in claim 7, wherein the etching stop layer and the sacrificial layer comprise different dielectric materials.

9. The method as claimed in claim 8, wherein the gap forming step comprises:
   partially removing the second dielectric layer, the etching stop layer and the sacrificial layer formed over the phase change material layer to expose a top surface of the phase change material layer and a portion of the sacrificial layer; and
   removing the second dielectric layer and a portion of the sacrificial layer such that the gap surrounds the phase change material layers.

10. The method as claimed in claim 9, wherein the second dielectric layer and a portion of the sacrificial layer removing step comprises a wet etching process.

11. The method as claimed in claim 7, wherein the phase change material layer comprises chalcogenide materials.

12. The method as claimed in claim 7, wherein the space comprises air or is under a nearly vacuum ambient.

* * * * *